(12) United States Patent
Kim

(10) Patent No.: US 10,334,742 B2
(45) Date of Patent: Jun. 25, 2019

(54) METHOD OF MANUFACTURING AN ELECTRIC DEVICE BASED ON GLASS SUBSTRATE

(71) Applicant: SAMSUNG ELECTRONICS CO., LTD., Suwon-si (KR)

(72) Inventor: Hongsuk Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 210 days.

(21) Appl. No.: 15/599,003

(22) Filed: May 18, 2017

(65) Prior Publication Data

US 2018/0139853 A1 May 17, 2018

(30) Foreign Application Priority Data

Nov. 16, 2016 (KR) ........................ 10-2016-0152963

(51) Int. Cl.
*H05K 3/20* (2006.01)
*H05K 3/46* (2006.01)
(Continued)

(52) U.S. Cl.
CPC ....... *H05K 3/4629* (2013.01); *H01L 21/6835* (2013.01); *H01L 21/78* (2013.01); *H01L 21/84* (2013.01); *H01L 51/003* (2013.01); *H01L 51/0024* (2013.01); *H01L 51/56* (2013.01); *H05K 1/0306* (2013.01); *H05K 3/007* (2013.01); *H05K 3/10* (2013.01); *H01L 27/1262* (2013.01);
(Continued)

(58) Field of Classification Search
CPC ........ H05K 3/4629; H05K 3/10; H05K 3/007; H05K 1/0306; H01L 51/003; H01L 51/56; H01L 21/84; H01L 21/78; H01L 51/0024; H01L 21/6835
USPC ........................................... 29/830, 831, 846
See application file for complete search history.

(56) References Cited

U.S. PATENT DOCUMENTS 4,275,494 A * 6/1981 Kohyama ......... G02F 1/133351
29/592.1
6,634,186 B2 * 10/2003 Abe ....................... C03B 33/04
216/108
(Continued)

FOREIGN PATENT DOCUMENTS

| KR | 10-2014-0036478 A | 3/2014 |
|---|---|---|
| KR | 10-1420263 B1 | 7/2014 |
| KR | 10-2014-0146514 A | 12/2014 |

*Primary Examiner* — Donghai D Nguyen
(74) *Attorney, Agent, or Firm* — Sughrue Mion, PLLC

(57) ABSTRACT

Provided is a method of manufacturing an electronic device, the method including: preparing first mother glass and second mother glass; forming, on the first mother glass, a plurality of device cells partially connected to the first mother glass through a plurality of first separating portions; patterning a device circuit on each of the plurality of device cells; forming, on the second mother glass, a plurality of cover cells partially connected to the second mother glass through a plurality of second separating portions; forming a plurality of electronic devices by laminating the first mother glass and the second mother glass together such that the plurality of device cells are respectively aligned to the plurality of cover cells; and separating the plurality of electronic devices from the first mother glass and the second mother glass by cutting the plurality of first separating portions and the plurality of second separating portions.

19 Claims, 15 Drawing Sheets

(51) Int. Cl.
*H01L 21/683* (2006.01)
*H01L 21/78* (2006.01)
*H01L 21/84* (2006.01)
*H01L 51/00* (2006.01)
*H05K 1/03* (2006.01)
*H05K 3/00* (2006.01)
*H05K 3/10* (2006.01)
*H01L 51/56* (2006.01)
*H01L 27/12* (2006.01)
*H01L 27/32* (2006.01)
*H01L 21/77* (2017.01)

(52) U.S. Cl.
CPC ........ *H01L 27/323* (2013.01); *H01L 27/3244* (2013.01); *H01L 51/0096* (2013.01); *H01L 2021/775* (2013.01); *H01L 2221/6835* (2013.01); *H01L 2221/68309* (2013.01); *H01L 2221/68377* (2013.01); *H01L 2227/323* (2013.01); *H01L 2251/566* (2013.01); *H05K 2203/176* (2013.01)

(56) References Cited

U.S. PATENT DOCUMENTS 8,658,049 B2 * 2/2014 Yen .................. G06F 3/044
216/100
2008/0171209 A1 7/2008 Nishiyama

* cited by examiner

METHOD OF MANUFACTURING AN ELECTRIC DEVICE BASED ON GLASS SUBSTRATE

CROSS-REFERENCE TO RELATED APPLICATION

This application claims priority from Korean Patent Application No. 10-2016-0152963, filed on Nov. 16, 2016, in the Korean Intellectual Property Office, the disclosure of which is incorporated herein in its entirety by reference.

BACKGROUND

1. Field

The present disclosure relates to a method of manufacturing an electronic device based on a glass substrate.

2. Description of the Related Art

An electronic device, such as a display panel, a touch panel, or a small sensor (e.g., a blood sugar sensor, a fingerprint sensor, or a chemical sensor), applied to a portable device, such as a wearable device, a smart phone, or a small digital information display (DID), is manufactured through a series of semiconductor processes based on a substrate.

As a thickness of the substrate is gradually reduced according to miniaturization, weight reduction, and thickness reduction of the portable device, a tempered glass is employed as the substrate instead of a synthetic resin substrate having low strength, such as polymethylmethacrylate (PMMA) or acryl. The tempered glass is glass obtained by performing thermal and/or chemical processes on regular glass to obtain mechanical durability.

Processes of manufacturing the electronic device employing the glass substrate may be classified into a sheet method and a cell method. In the sheet method, mother glass is entirely tempered, a plurality of electronic devices are patterned on the mother glass, and then the mother glass is cut to individually separate the plurality of electronic devices. According to the sheet method, the top and bottom surfaces of the substrate are tempered, but a side surface that is a cut surface is not tempered, and thus strength of the substrate may be weakened. In the cell method, mother glass is cut to obtain a plurality of cells, and tempering processes are performed on each of the plurality of cells. Then, an electronic device is patterned on each of the plurality of cells. According to the cell method, since tempering and patterning processes are performed according to unit cells, productivity is relatively low. Also, in the cell method, the cells are supported by a jig to temper and pattern the cells, but a patterning defect may occur according to machining tolerance of the jig.

SUMMARY

Provided is a method of manufacturing an electronic device based on a glass substrate, whereby productivity is increased.

Provided is a method of manufacturing an electronic device based on a glass substrate, whereby durability is increased.

Additional aspects will be set forth in part in the description which follows and, in part, will be apparent from the description, or may be learned by practice of various exemplary embodiments.

According to an aspect of an exemplary embodiment, a method of manufacturing an electronic device is provided. The method may include: preparing first mother glass and second mother glass; forming, on the first mother glass, a plurality of device cells partially connected to the first mother glass through a plurality of first separating portions; patterning a device circuit on each of the plurality of device cells; forming, on the second mother glass, a plurality of cover cells partially connected to the second mother glass through a plurality of second separating portions; forming a plurality of electronic devices by laminating the first mother glass and the second mother glass together such that the plurality of device cells are respectively aligned to the plurality of cover cells; and separating the plurality of electronic devices from the first mother glass and the second mother glass by cutting the first plurality of separating portions and the second plurality of separating portions.

Widths of the plurality of first separating portions and the plurality of second separating portions may each range between 0.1 mm and 0.5 mm.

The plurality of first separating portions and the plurality of second separating portions may be respectively aligned with each other to function as alignment keys while the first mother glass and the second mother glass are laminated together.

The plurality of first separating portions and the plurality of second separating portions may be misaligned with each other.

The first mother glass and the plurality of device cells may be formed by creating a plurality of first slits on the first mother glass, and the plurality of first separating portions may connect the plurality of device cells and the first mother glass across the plurality of first slits. The second mother glass and the plurality of cover cells may be formed by creating a plurality of second slits on the second mother glass, and the plurality of second separating portions may connect the plurality of cover cells and the second mother glass across the plurality of second slits.

The plurality of first slits and the plurality of second slits may function as alignment keys while the first mother glass and the second mother glass are laminated together.

The method may further include forming a first alignment key and a second alignment key respectively on the first mother glass and the second mother glass, wherein the first and second alignment keys may be bases for alignment while the first mother glass and the second mother glass are laminated together. The first and second alignment keys may be formed in regions other than the plurality of device cells and the plurality of cover cells.

A thickness of the first mother glass may be less than 0.3 mm. The method may further include: adhering the first mother glass to a support substrate before the forming of the plurality of device cells; and removing the support substrate after the patterning of the device circuit.

A thickness of the first mother glass may be greater than or equal to 0.3 mm, and the method may further include slimming the thickness of the first mother glass after the patterning of the device circuit.

The method may further include tempering the first mother glass after the forming of the plurality of device cells. The method may further include forming a first alignment key on the first mother glass, wherein the first alignment key may be a basis for alignment while the first mother glass and the second mother glass are laminated together. The first alignment key may be printed on the first mother glass after the tempering of the first mother glass.

The first alignment key may be carved on the first mother glass before the tempering of the first mother glass.

The method may further include tempering the second mother glass after the forming of the plurality of cover cells. The method may further include forming a second alignment key on the second mother glass, wherein the second alignment key may be a basis for alignment while the first mother glass and the second mother glass are laminated together. The second alignment key may be printed on the second mother glass after the tempering of the second mother glass. The second alignment key may be carved on the second mother glass before the tempering of the second mother glass.

BRIEF DESCRIPTION OF THE DRAWINGS

The above and/or other aspects will become apparent and more readily appreciated from the following description of various exemplary embodiments, taken in conjunction with the accompanying drawings in which.

DETAILED DESCRIPTION

Figure 1A:
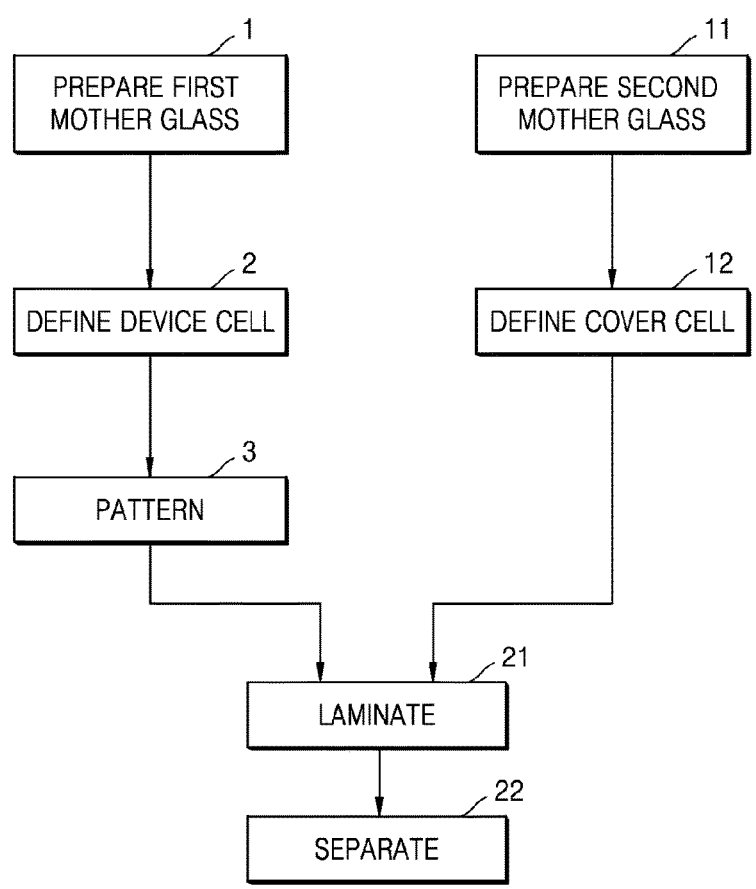
FIGS. 1A and 1B are flowcharts of a method of manufacturing an electronic device based on a glass substrate, according to an exemplary embodiment.

All terms including descriptive or technical terms which are used herein should be construed as having meanings that are obvious to one of ordinary skill in the art. However, the terms may have different meanings according to the intention of one of ordinary skill in the art, precedent cases, or the appearance of new technologies. Also, some terms may be arbitrarily selected by the applicant, and in this case, the meaning of the selected terms will be described in detail in the detailed description of the invention. Thus, the terms used herein have to be defined based on the meaning of the terms together with the description throughout the specification.

In the specification, when a region is "connected" to another region, the regions may not only be "directly connected," but may also be "electrically connected" via another device therebetween. Also, when a part "includes" or "comprises" an element, unless there is a particular description contrary thereto, the part can further include other elements, not excluding the other elements. In the following description, terms such as "unit" and "module" indicate a unit for processing at least one function or operation, wherein the unit and the block may be embodied as hardware or software or embodied by combining hardware and software.

It will be further understood that the terms "includes" or "comprises" used herein specify the presence of stated features or components, but do not preclude the presence or addition of one or more other features or components.

It will be understood that although the terms "first," "second," etc. may be used herein to describe various components, these components should not be limited by these terms. These components are only used to distinguish one component from another.

Reference will now be made in detail to various exemplary embodiments, which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects.

Figure 1B:
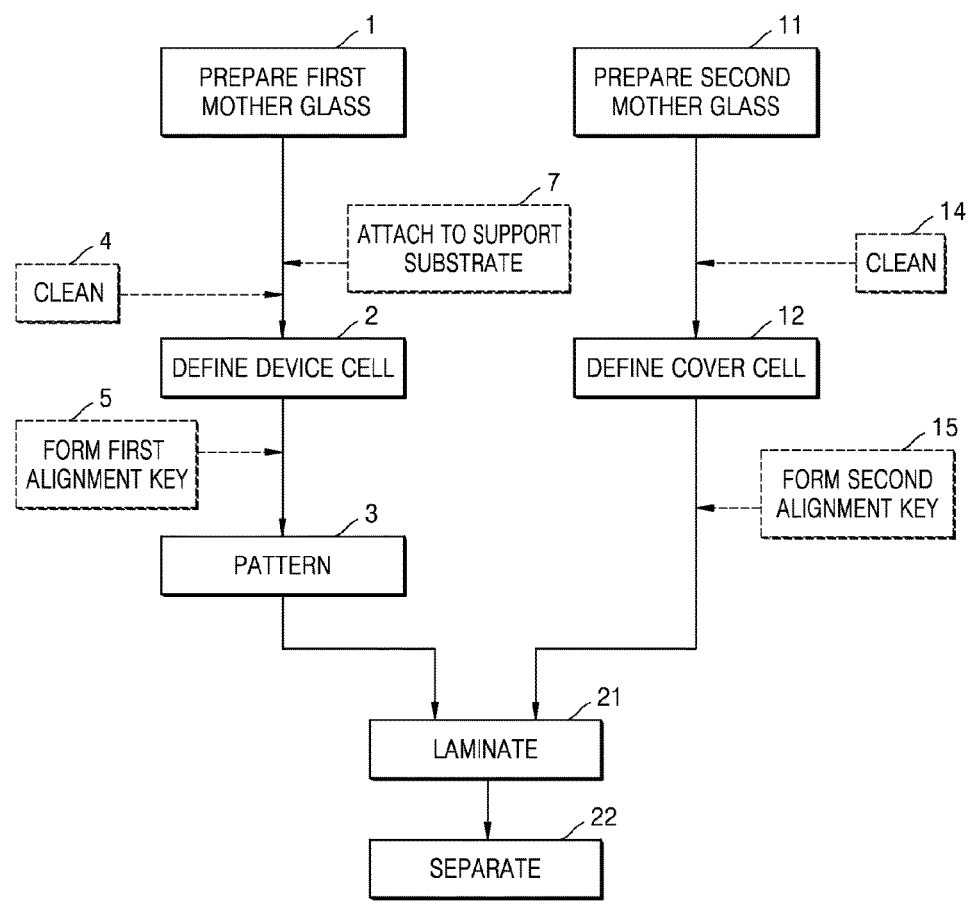
Figure 2:
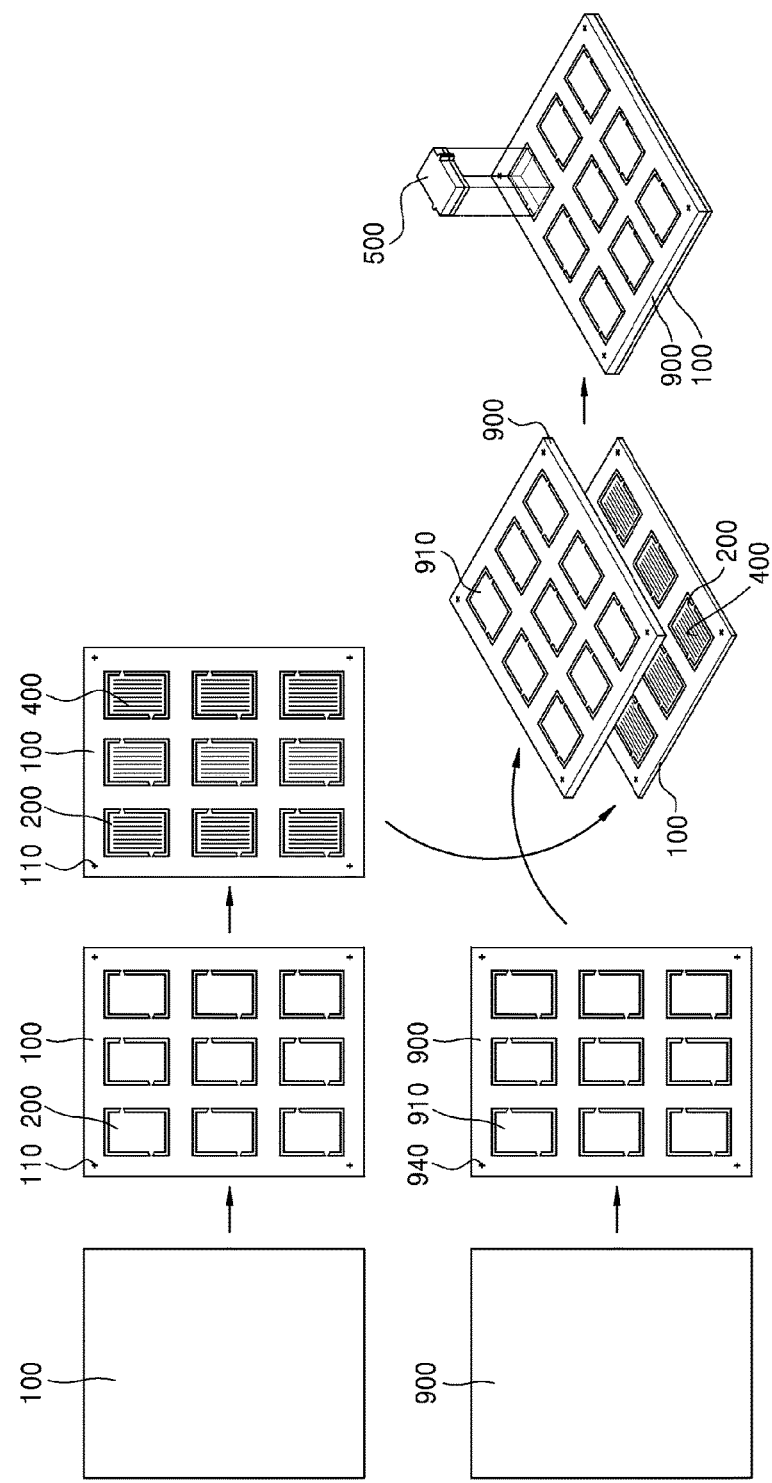
FIG. 2 is a schematic view for describing a method of manufacturing an electronic device based on a glass substrate, according to an exemplary embodiment.

FIGS. 1A and 1B are flowcharts of a method of manufacturing an electronic device based on a glass substrate, according to an exemplary embodiment. FIG. 2 is a schematic view for describing a method of manufacturing an electronic device based on a glass substrate, according to an exemplary embodiment. Referring to FIGS. 1A, 1B, and 2, the method according to an exemplary embodiment may include preparing first mother glass 100 (e.g., a first substrate) in operation 1, defining (e.g., forming) a plurality of device cells 200 in operation 2, patterning a device circuit 400 in operation 3, preparing a second mother glass 900 (e.g., a second substrate) in operation 11, defining (e.g., forming) a plurality of cover cells in operation 12, laminating the first mother glass 100 and the second mother glass 900 in operation 21, and separating an electronic device 500 in operation 22.

Figure 3:
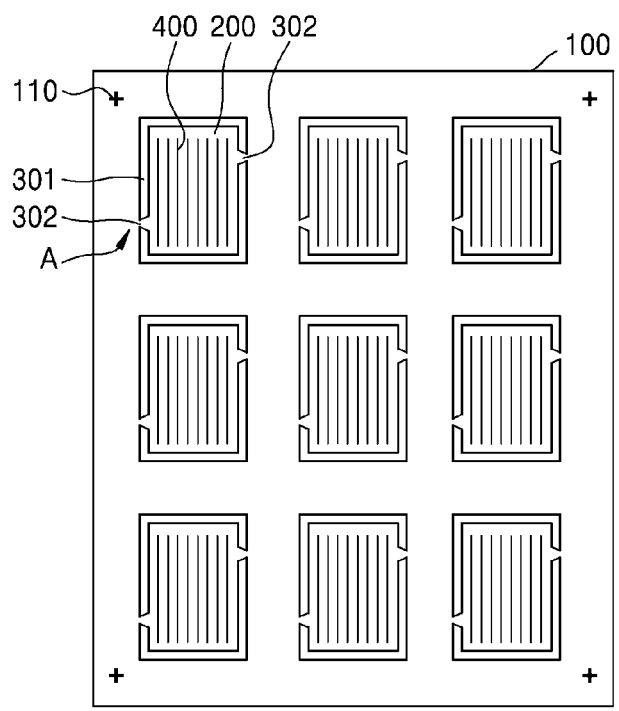
FIG. 3 is a plan view for describing defining of a plurality of device cells.

FIG. 3 is a plan view for describing the defining of the plurality of device cells 200 in operation 2. Referring to FIGS. 2 and 3, the first mother glass 100 is prepared in operation 1. The first mother glass 100 may be, for example, soda-lime silicate glass or aluminosiliccate glass. A size of the first mother glass 100 is not limited to what is shown in FIG. 3.

Then, a process of defining a region (e.g., the device cell 200), in which the device circuit 400 is to be formed, is performed on the first mother glass 100 in operation 2. Operation 2 may be performed by partially penetrating through an outer region of the device cell 200 such that the device cell 200 is not completely separated from the first mother glass 100. Operation 2 may be performed via any one of various well-known methods, such as a water-jet method, a dry or wet etching method, and a laser ablation method. By performing operation 2, the device cell 200 is delineated from the first mother glass 100 by a first slit 301 surrounding the outer region of the device cell 200 and is connected to the first mother glass 100 by at least one first separating portion 302 crossing the first slit 301. Accordingly, the plurality of device cells 200 that are partially connected to the first mother glass 100 by the first separating portion 302 are formed.

Figure 4:
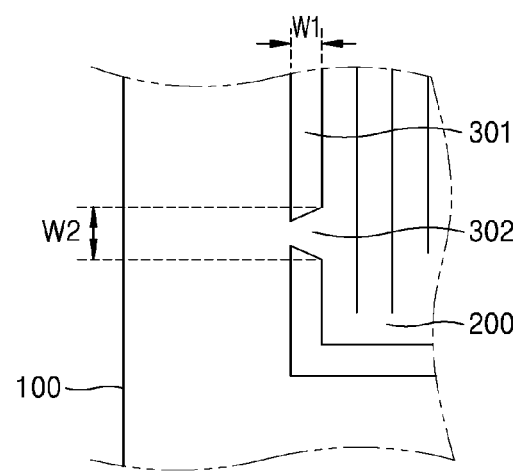
FIG. 4 is an enlarged view of a portion A of FIG. 3.

FIG. 4 is an enlarged view of a portion A of FIG. 3. Referring to FIG. 4, a width W1 of the first slit 301 is not limited to what is shown. The width W1 of the first slit 301 may be suitably determined such that the device cell 200 is delineated from the first mother glass 100 and a size of the first separating portion 302 left at the device cell 200 after operation 22 is as small as possible (e.g., without breaking off). The number of first separating portions 302 may be one or more. A width W2 and the number of first separating portions 302 may be suitably determined in consideration of a thickness of the first mother glass 100 such that the device cell 200 maintains a connection to the first mother glass 100 while subsequent operations are performed. The width W2 of the first separating portion 302 may be from about 0.1 mm to about 0.5 mm. A shape of the first separating portion 302 is not limited to what is shown in FIG. 4. The first separating portion 302 may have any one of various shapes, such as a wedge shape (see FIG. 4), a trapezoid shape, a rectangular shape, and a shape of two or more continuous wedges.

Before operation 2, the first mother glass 100 may be cleaned in operation 4. The first mother glass 100 may be cleaned via an acid dip process, a rinsing process, and/or a drying process. Since cleaning of glass is well known in the related art, details thereof are not provided herein.

Then, the patterning is performed in operation 3. Operation 3 may be suitably performed according to a type of the electronic device 500. The electronic device 500 may be, for example, a display panel, a touch panel, or a miniature sensor (e.g., a blood sugar sensor, a fingerprint sensor, or a chemical sensor), and in operation 3, the device circuit 400 according to the type of the electronic device 500 is formed via processes including a series of semiconductor processes. Operation 3 is performed all at once with respect to the plurality of device cells 200, and thus productivity may be increased compared to conventional cell methods.

Figure 5:
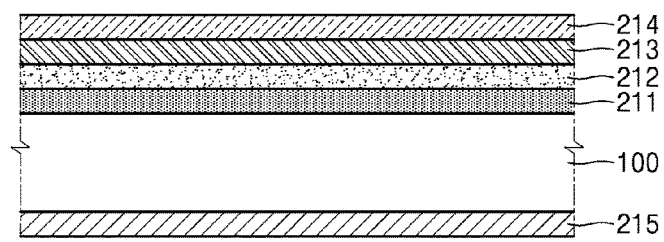
FIG. 5 is a schematic cross-sectional view of a display panel according to an exemplary embodiment.

For example, the electronic device 500 may be a display panel. FIG. 5 is a schematic cross-sectional view of a display panel according to an exemplary embodiment. The display panel shown in FIG. 5 is, for example, an active matrix organic light-emitting diode panel (AMOLED). Referring to FIG. 5, the display panel is manufactured by using the first mother glass 100 as a substrate. The display panel is formed by laminating, on the first mother glass 100, a driving device array 211 (e.g., a thin-film transistor (TFT) array), an organic electroluminescence layer 212, a cathode electrode layer 213, and an encapsulation layer 214. A reflection layer 215 for emitting light towards the encapsulation layer 214 may be provided below the first mother glass 100. Since a structure of AMOLED is well known to one of ordinary skill in the art, details thereof are not provided herein. Since AMOLED is a self-emitting type display panel, in which light is generated in the organic electroluminescence layer 212 by a driving signal, a separate light source, such as a backlight, is not required, unlike a liquid crystal display (LCD) panel. Accordingly, AMOLED may be very thin compared to the liquid crystal display panel.

Figure 6:
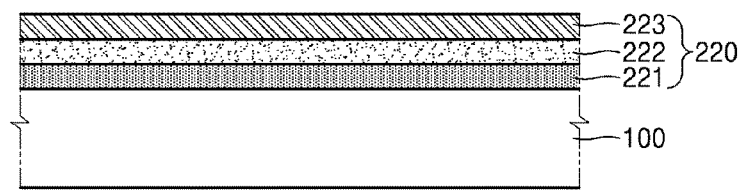
FIG. 6 is a schematic cross-sectional view of a touch panel according to an exemplary embodiment.

For example, the electronic device 500 may be a touch panel. FIG. 6 is a schematic cross-sectional view of a touch panel according to an exemplary embodiment. The touch panel shown in FIG. 6 is, for example, a capacitive touch panel. Referring to FIG. 6, the touch panel is manufactured by using the first mother glass 100 as a substrate. The touch panel may include a touch electrode layer 220 formed on the first mother glass 100. The touch electrode layer 220 may include a plurality of horizontal electrodes 221, a plurality of vertical electrodes 223, and a dielectric layer 222 provided between the plurality of horizontal electrodes 221 and the plurality of vertical electrodes 223. A region where the horizontal and vertical electrodes 221 and 223 cross each other is a detection region. The horizontal and vertical electrodes 221 and 223 may be formed by patterning, to a thin-film shape, a conductive metal, such as indium tin oxide (ITO), copper metal mesh, or silver nano-wire, via a vacuum deposition method, a sputtering method, or a plating method. The horizontal electrode 221 may be a driving electrode and the vertical electrode 223 may be a receiving electrode. The first mother glass 100 may further include a driving circuit for applying a driving voltage to the driving electrode, and a detecting circuit for detecting electrostatic capacity information from the receiving electrode. The driving circuit and the detecting circuit may have, for example, a complementary metal-oxide semiconductor (CMOS) circuit structure.

Figure 7:
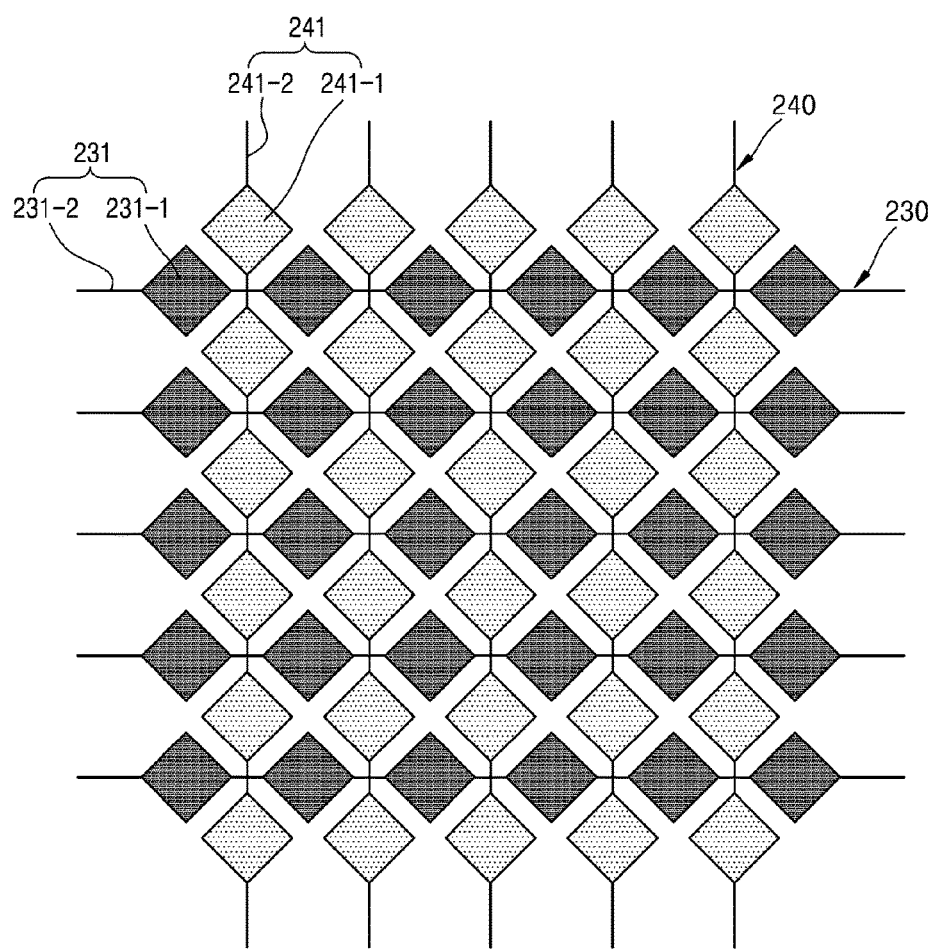
FIG. 7 is a schematic plan view of a fingerprint sensor according to an exemplary embodiment.

For example, the electronic device 500 may be a fingerprint sensor. FIG. 7 is a schematic plan view of a fingerprint sensor according to an exemplary embodiment. Referring to FIG. 7, the fingerprint sensor has the same structure as the touch sensor. The fingerprint sensor is formed by using the first mother glass 100 as a substrate. The fingerprint sensor may include a first electrode layer 230 and a second electrode layer 240, which face each other across a dielectric layer.

The first electrode 230 may be formed by patterning, to a thin-film shape, a conductive metal, such as ITO, copper metal mesh, or silver nano-wire, via a vacuum deposition method, a sputtering method, or a plating method. The first electrode layer 230 may include a plurality of horizontal electrodes 231, and the second electrode layer 240 may include a plurality of vertical electrodes 241. Each of the horizontal electrodes 231 may include a plurality of rhombus patterns 231-1 and a linear pattern 231-2 connecting the rhombus patterns 231-1. Similarly, each of the vertical electrodes 241 may include a plurality of rhombus patterns 241-1 and a linear pattern 241-2 connecting the rhombus patterns 231-1. A region where the linear patterns 231-2 and 241-2 cross each other is a detection region. The rhombus pattern 231-1 may be a solid pattern or a hollow linear pattern. Any one of various patterns, such as a quadrilateral pattern or a hexagonal pattern, may be applied instead of the rhombus pattern 231-1 or 241-1.

The horizontal electrode 231 may be a driving electrode and the vertical electrode 241 may be a receiving electrode. The first mother glass 100 may further include a driving circuit for applying a driving voltage to the driving electrode, and a detecting circuit for detecting electrostatic capacity information from the receiving electrode. The driving circuit and the detecting circuit may have, for example, a CMOS circuit structure.

The structures of the display panel, the touch panel, and the fingerprint sensor shown in FIGS. 5 through 7 are only examples. The electronic device 500 may have any one of various shapes capable of being manufactured through a series of semiconductor patterning processes.

Figure 8:
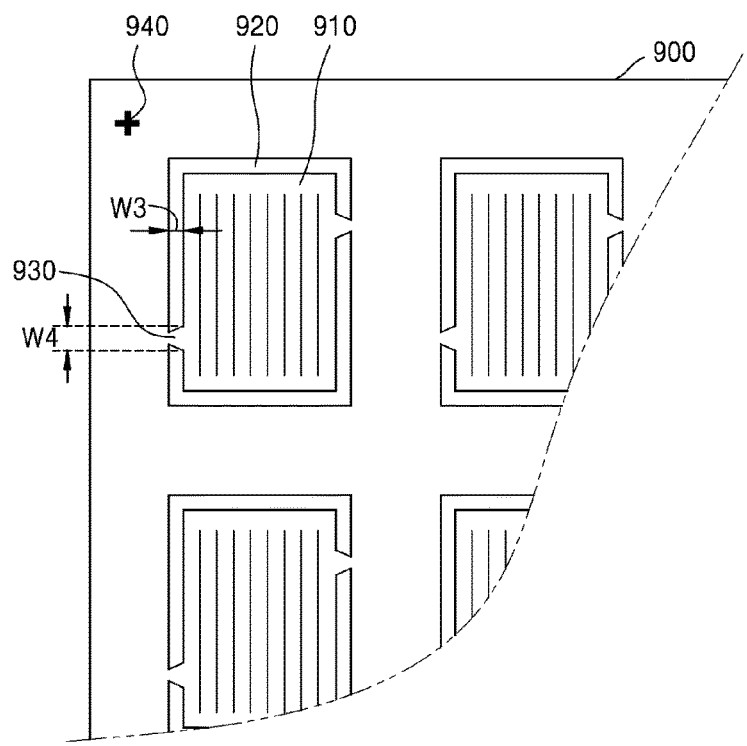
FIG. 8 is a plan view for describing defining of a cover cell.

Then, a process of manufacturing cover glass will now be described. FIG. 8 is a plan view for describing defining of a cover cell 910 in operation 12. Referring to FIGS. 1A, 1B, 2 and 8, the second mother glass 900 is prepared in operation 11. The second mother glass 900 may be, for example, soda-lime silicate glass or aluminosiliccate glass. A size of the second mother glass 900 is not limited to what is shown in FIG. 8. The size of the second mother glass 900 may be the same as the size of the first mother glass 100 considering that the second mother glass 900 is laminated on the first mother glass 100 in operation 21. However, the first mother glass 100 and the second mother glass 900 may be of different sizes.

Then, the cover cell 910 corresponding to the device cell 200 is defined in the second mother glass 900 in operation 12. Operation 12 may be performed by partially penetrating through an outer region of the cover cell 910 such that the cover cell 910 is not completely separated from the second mother glass 900. Operation 12 may be performed via any one of various well-known methods, such as a water-jet method, a dry or wet etching method, and a laser ablation method. By performing operation 12, the cover cell 910 may be delineated from the second mother glass 900 by a second slit 920 surrounding the outer region of the cover cell 910 and is connected to the second mother glass 900 by at least one second separating portion 930 crossing the second slit 920. Accordingly, the plurality of cover cells 910 that are partially connected to the second mother glass 900 by the second separating portion 930 are formed. A width pitch and a height pitch of the cover cell 910 may be the same as those of the device cell 200.

A width W3 of the second slit 920 is not limited to what is shown in FIG. 8. The width W3 of the second slit 920 may be suitably determined such that the cover cell 910 is separated from the second mother glass 900 and a size of the second separating portion 930 left at the cover cell 910 after operation 22 is as small as possible (e.g., without breaking off). The number of second separating portions 930 may be one or more. A width W4 and the number of second separating portions 930 may be suitably determined in consideration of a thickness of the second mother glass 900 such that the cover cell 910 maintains a connection to the second mother glass 900 while subsequent operations are performed. The width W4 of the second separating portion 930 may be from about 0.1 mm to about 0.5 mm. A shape of the second separating portion 930 is not limited to what is shown in FIG. 8. The second separating portion 930 may have any one of various shapes, such as a wedge shape (see FIG. 8), a trapezoid shape, a rectangular shape, and a shape of two or more continuous wedges.

Before operation 12, the second mother glass 900 may be cleaned in operation 14. The second mother glass 900 may be cleaned via an acid dip process, a rinsing process, and/or a drying process. Since cleaning of glass is well known in the related art, details thereof are not provided herein.

Then, operation 21 is performed. In operation 21, the first mother glass 100 and the second mother glass 900 are adhered to each other by using an adhesive. In operation 21, the first mother glass 100 and the second mother glass 900 are laminated such that the plurality of device cells 200 and the plurality of cover cells 910 are aligned to form the plurality of electronic devices 500. The adhesive may be transparent or opaque according to a type of the electronic device 500. When the electronic device 500 is a display panel, a touch panel, or a fingerprint sensor, the adhesive may be, for example, an optically clear adhesive (OCA) film or an optically clear resin (OCR). For example, operation 21 may be performed by adhering an OCA film to the first mother glass 100, overlapping the second mother glass 900 thereon, and then pressurizing, or heating and pressurizing the first and second mother glass 100 and 900 by using a roll. When the OCR is used, the OCR is quantitatively discharged on the first or second mother glass 100 or 900 via a one drop filling (ODF) process so as to prevent contamination caused by overflow and a defect caused by contamination. Then, the first mother glass 100 and the second mother glass 900 are vacuum-sealed, and then the OCR is hardened by irradiating ultraviolet (UV) light onto the first and second mother glass 100 and 900.

Figure 9:
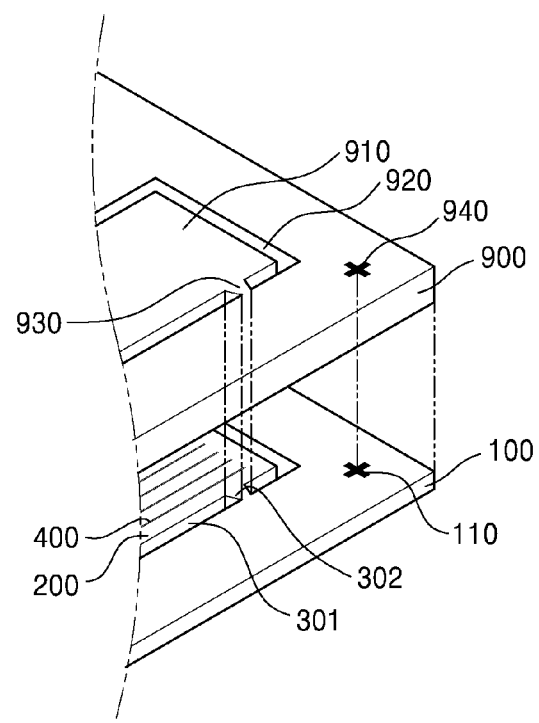
FIG. 9 is a perspective view of an arrangement of first and second separating portions, according to an exemplary embodiment.

In operation 21, an alignment key may be required so as to align the device cell 200 and the cover cell 910. An alignment key may serve as a basis or guide for alignment while the first mother glass 100 and the second mother glass 900 are laminated together. For example, when the cover cell 910 and the device cell 200 have the same size and the same shape, the first and second slits 301 and 920 may function as alignment keys. Also, as shown in FIG. 9, when the first and second separation portions 302 and 930 are aligned with each other, the first and second separating portions 302 and 930 may function as alignment keys.

In order to align the device cell 200 and the cover cell 910, first and second alignment keys 110 and 940 may be respectively formed on the first mother glass 100 and the second mother glass 900 as shown in FIGS. 2, 3, and 8, in operation 21 or prior to operation 21.

The first and second alignment keys 110 and 940 may be formed via a printing process. For example, the first and second alignment keys 110 and 940 may be printed respectively on the first mother glass 100 and the second mother glass 900 by using polymer-based ink.

The first and second alignment keys 110 and 940 may be carved respectively on the first mother glass 100 and the second mother glass 900. For example, the first and second alignment keys 110 and 940 may be carved respectively on the first mother glass 100 and the second mother glass 900 via any one of various well-known methods, such as a water-jet method, a dry or wet etching method, a laser ablation method, and a laser marking method. The first and second alignment keys 110 and 940 may be carved to a certain depth respectively from surfaces of the first mother glass 100 and the second mother glass 900, to penetrate respectively through the first mother glass 100 and the second mother glass 900, or to be acknowledgeable respectively by internal property variations in thickness directions of the first mother glass 100 and the second mother glass 900. Shapes of the first and second alignment keys 110 and 940 are not limited to cross shapes shown in FIGS. 2, 3, and 8, and may vary, such as arrow shapes or triangular shapes, as long as the plurality of device cells 200 and the plurality of cover cells 910 are aligned.

When the first and second alignment keys 110 and 940 are formed via carving, operations 5 and 15 of forming the first and second alignment keys 110 and 940 may be performed together with operations 2 and 12, or before or after operations 2 and 12. Accordingly, the first and second alignment keys 110 and 940 are formed in the same manner as the device cells 200 and the cover cells 910 are defined in operation 2 and 12, and thus process efficiency may be increased.

Then, operation 22 is performed. In operation 22, the first and second separating portions 302 and 930 are cut to separate the device cell 200 and the cover cell 910 respectively from the first mother glass 100 and the second mother glass 900, thereby obtaining the electronic device 500. Operation 22 may be performed via any one of various methods, such as a water-jet method, a dry or wet etching method, a laser ablation method, and a laser scribing method.

Figure 10:
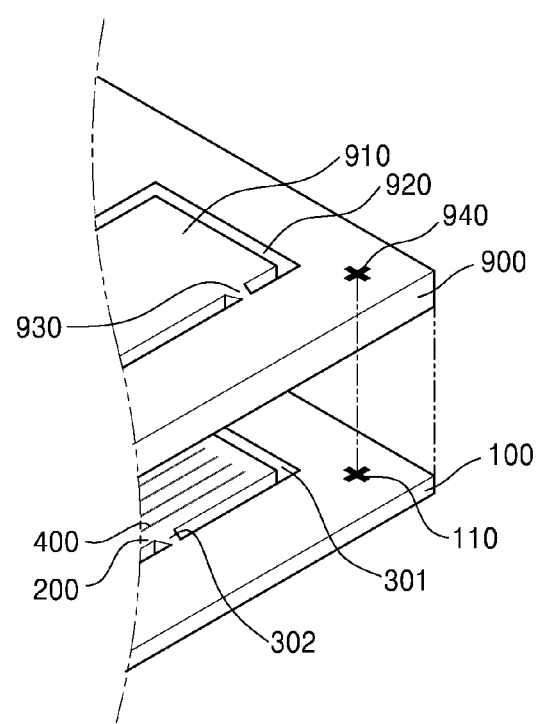
FIG. 10 is a perspective view of an arrangement of first and second separating portions, according to another exemplary embodiment.

FIGS. 9 and 10 are perspective views of an arrangement of the first and second separating portions 302 and 930, according to an exemplary embodiment. The first and second separating portions 302 and 930 may be aligned as shown in FIG. 9. In this case, the first mother glass 100 and the second mother glass 900 may be simultaneously cut. In operation 21, the first and second separating portions 302 and 930 may function as alignment keys.

Also, the first and second separating portions 302 and 930 may be misaligned as shown in FIG. 10. That is, the first and second separating portions 302 and 930 may not overlap. In this case, the first separating portion 302 may be cut through the second slit 920, and the second separating portion 930 may be cut through the first slit 301.

In operation 21, the plurality of device cells 200 and the plurality of cover cells 910 are each aligned and simultaneously attached, and after operation 21, the plurality of device cells 200 and the plurality of cover cells 910 are simultaneously separated to obtain the plurality of electronic devices 500. Accordingly, productivity may be largely increased compared to a conventional cell method in which the plurality of device cells 200 and the plurality of cover cells 910 are each separated and then individually laminated one by one.

Figure 11:
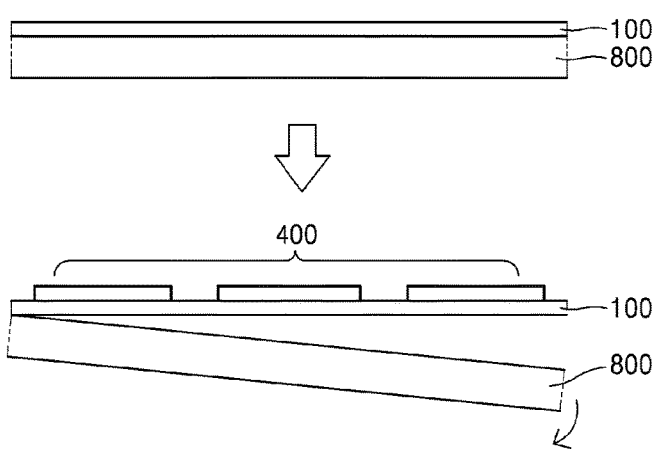
FIG. 11 is a view of attaching first mother glass to a support substrate, and removing the support substrate after process completion, according to an exemplary embodiment.

When the thickness of the first mother glass 100 is less than 0.3 mm (e.g., from 0.05 mm to 0.21 mm), the first mother glass 100 may be damaged during operations. For example, the first mother glass 100 may be damaged due to water pressure during a rinsing process or air pressure during a drying process in operation 4. In this regard, the method of the current embodiment may further include, as shown in FIGS. 1B and 11, attaching the first mother glass 100 to a support substrate 800 in operation 7, after the first mother glass 100 is prepared. The support substrate 800 may be, for example, glass. An adhesive used in operation 7 may be transparent or opaque according to the type of the electronic device 500. When the electronic device 500 is a display panel, a touch panel, or a fingerprint sensor, the adhesive may be, for example, an OCA film or an OCR. When operation 7 is performed, the first slit 301 may penetrate only through the first mother glass 100 in operation 2, or may penetrate also through the support substrate 800. As such, by further performing operation 7, a defect rate may be reduced even when the thin first mother glass 100 is used. After operation 21, the support substrate 800 may be separated from the first mother glass 100.

When the thickness of the first mother glass 100 is equal to or greater than 0.3 mm, operation 7 may not be performed. Since the second mother glass 900 is generally thicker than the first mother glass 100, the second mother glass 900 need not be attached to a support substrate such as the support substrate 800.

Figure 12:
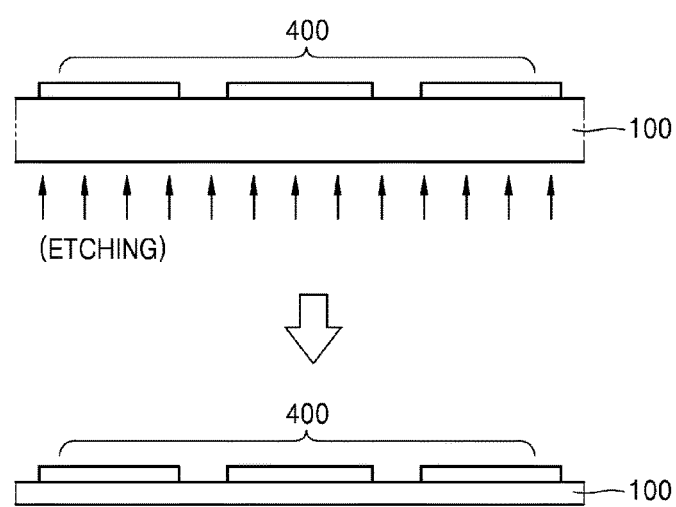
FIG. 12 is a view of a slimming process of reducing a thickness of first mother glass, according to an exemplary embodiment.

In order to resolve a strength issue of a thin substrate during operations, a thick substrate of at least 0.3 mm may be used as the first mother glass 100 to perform the above-described operations, and before operation 21 or 22, the thickness of the first mother glass 100 may be slimmed as shown in FIG. 12. The first mother glass 100 may be slimmed by etching a bottom surface of the first mother glass 100 (i.e., a surface of the first mother glass 100 that is opposite to a surface where the device circuit 400 is formed).

Figure 13A:
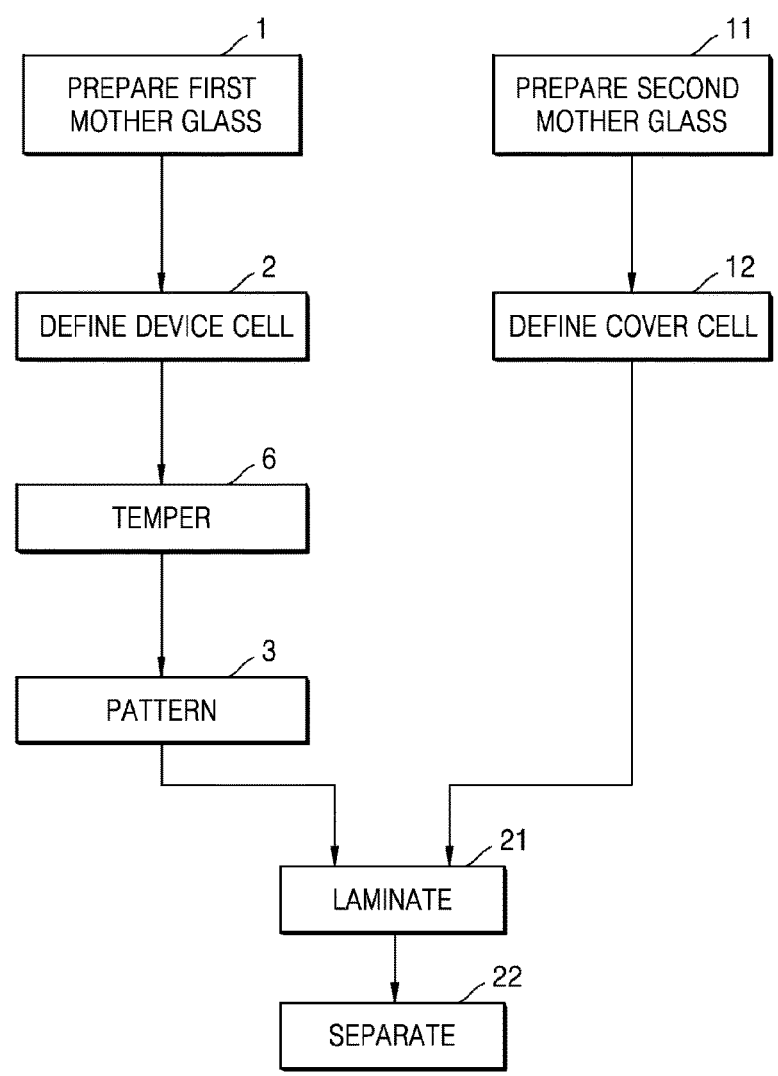
FIGS. 13A and 13B are flowcharts of a method of manufacturing an electronic device based on a glass substrate, according to an exemplary embodiment.
Figure 13B:
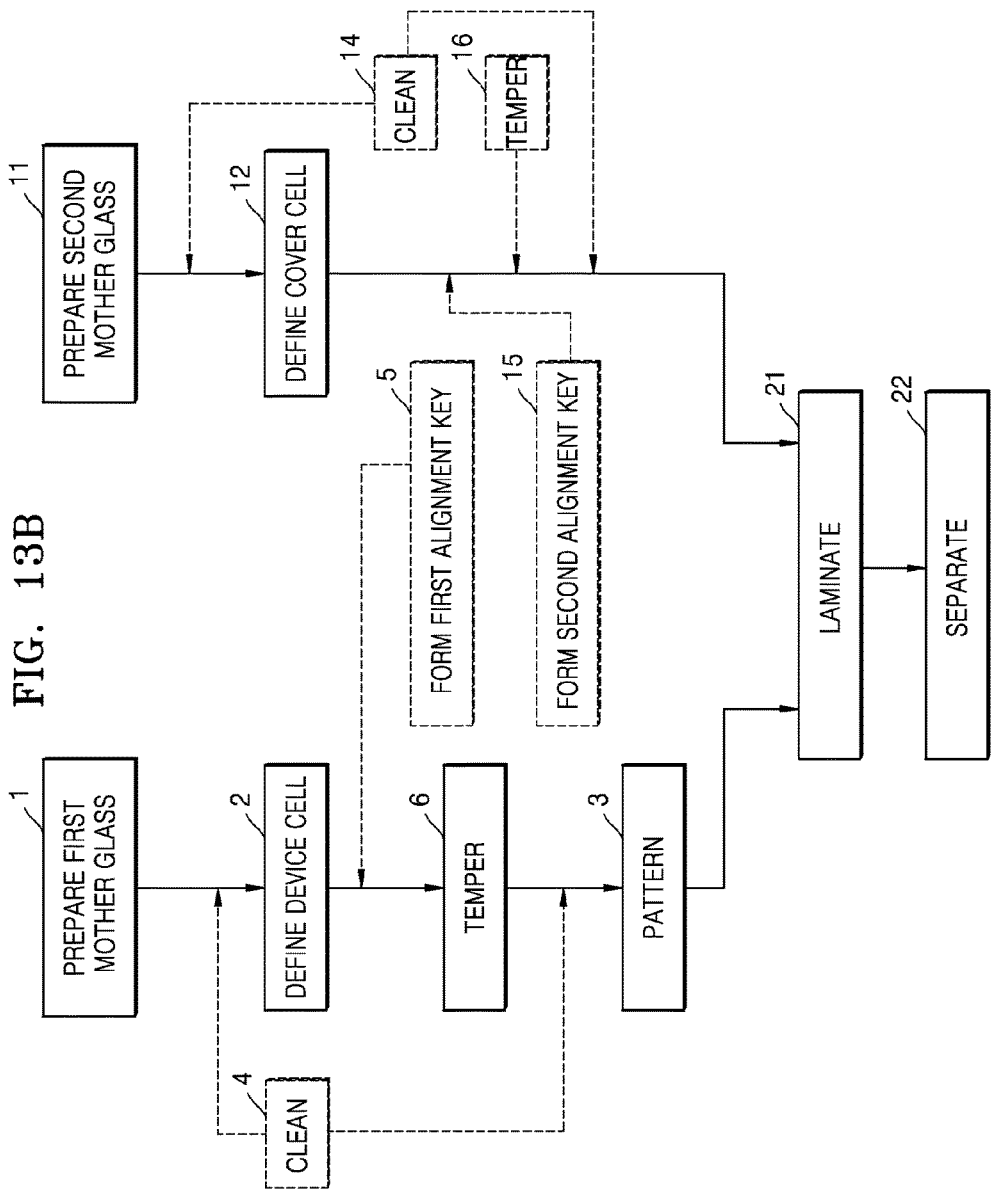

FIGS. 13A and 13B are flowcharts of a method of manufacturing an electronic device based on a glass substrate, according to an exemplary embodiment. The exemplary embodiment illustrated in FIGS. 13A and 13B may be different from that of FIGS. 1A and 1B in that the method according to the exemplary embodiment of FIGS. 13A and 13B further includes operations 6 and 16. Details overlapping those of FIGS. 1A and 1B are briefly described, and operations 6 and 16 will be mainly described.

First, the first mother glass 100 is prepared in operation 1. When the thickness of the first mother glass 100 is 0.05 mm to 0.21 mm, the first mother glass 100 may be attached to the support substrate 800 as shown in FIG. 11.

Then, the region (e.g., the device cell 200) where the device circuit 400 is to be formed is defined in the first mother glass 100 in operation 2. Accordingly, the device cell 200 is delineated from the first mother glass 100 by the first slit 301 surrounding the outer region of the device cell 200, and is connected to the first mother glass 100 by the at least one first separating portion 302 crossing the first slit 301. The first slit 301 may penetrate up to the support substrate 800, if attached. The number of first separating portions 302 may be one or more. The width W1 of the first slit 301, and the width W2 and number of first separating portions 302 may be suitably determined in consideration of the thickness of the first mother glass 100 such that the device cell 200 may maintain a connection to the first mother glass 100 while subsequent operations are performed, and the size of the first separating portion 302 left at the device cell 200 after operation 22 is as small as possible. After operation 2, top, bottom, and side surfaces of the device cell 200 are all tempered in operation 6, but a region where the first separating portion 302 exists is not tempered. Accordingly, the width W2 and number of first separating portions 302 may be as small as possible so as to reduce an un-tempered region in the device cell 200. The width W2 of the first separating portion 302 may be from about 0.1 mm to about 0.5 mm.

Before operation 2 is performed, operation 4 of cleaning the first mother glass 100 may be performed.

Operation 6 may be performed via any one of various methods, such as a thermal tempering method and a chemical tempering method. A depth of layer (DOL) may be dozens of micrometers, for example, about 20 μm. By performing operation 6, the top and bottom surfaces of the first mother glass 100, and the side surfaces of the first mother glass 100, excluding a region where the first separating portion 302 is formed, are tempered. Accordingly, durability of the first mother glass 100 may be increased compared to a conventional sheet method.

Then, operation 3 is performed. Operation 3 may be suitably performed according to the type of the electronic device 500. The electronic device 500 may be, for example, a display panel, a touch panel, or a miniature sensor (e.g., a blood sugar sensor, a fingerprint sensor, or a chemical sensor), and in operation 3, the device circuit 400 is formed through processes including a series of semiconductor processes, according to the type of the electronic device 500. Operation 3 is performed all at once with respect to the plurality of device cells 200, and thus productivity may be increased compared to conventional cell methods.

Operation 4 may be performed again after operation 6 and before operation 3.

Then, a process of manufacturing cover glass is performed, although the process of manufacturing the cover cells (e.g., operations 1, 2, 6, 3, etc.) may be performed substantially at the same time with the process of manufacturing the device cells (e.g., operations 11, 12, etc.) to increase productivity. As shown in FIGS. 13A and 13B, the second mother glass 900 is prepared in operation 11.

Then, the cover cell 910 corresponding to the device cell 200 is defined in the second mother glass 900 in operation 12. By performing operation 12, as shown FIG. 8, the cover cell 910 is delineated from the second mother glass 900 by the second slit 920 surrounding the outer region of the cover cell 910 and is connected to the second mother glass 900 by at least one second separating portion 930 crossing the second slit 920. A width and a height of the cover cell 910 may be the same as those of the device cell 200.

The number of second separating portion 930 may be one or more. The width W3 of the second slit 920, and the width W4 and number of the second separating portions 930 may be suitably determined in consideration of the thickness of the second mother glass 900 such that the cover cell 910 maintains a connection to the second mother glass 900 while subsequent operations are performed, and a size of the second separating portion 930 left at the cover cell 910 after operation 22. After operation 12, top, bottom, and side surfaces of the cover cell 910 may all be tempered, but a region where the second separating portion 930 existed may not be tempered. Accordingly, the width W4 and number of second separating portions 930 may be as small as possible so as to reduce an un-tempered region in the cover cell 910. The width W4 of the second separating portion 930 may be from about 0.1 mm to about 0.5 mm.

Before operation 12, the second mother glass 990 may be cleaned in operation 14.

If required, tempering in operation 16 may be further performed. Operation 16 may be performed via any one of various well-known methods, such as a thermal tempering method and a chemical tempering method. A DOL may be dozens of micrometers, for example, about 20 μm. By performing operation 16, the top and bottom surfaces of the second mother glass 900, and the side surfaces of the second mother glass 900, excluding a region where the second separating portion 930 is formed, are tempered. Accordingly, durability of the cover glass may be increased compared to a conventional sheet method.

Operation 14 may be performed again after operation 16 and before operation 21.

Then, operation 21 is performed. In operation 21, the first mother glass 100 and the second mother glass 900 are adhered to each other by using an adhesive. In operation 21, the first mother glass 100 and the second mother glass 900 are laminated such that the plurality of device cells 200 and the plurality of cover cells 910 are aligned, thereby forming the plurality of electronic devices 500. The adhesive may be transparent or opaque based on the type of the electronic device 500. When the electronic device 500 is a display panel, a touch panel, or a fingerprint sensor, the adhesive may be, for example, an OCA film or an OCR.

In operation 21, in order to align the device cell 200 and the cover cell 910, an alignment key may be required. For example, when the sizes and shapes of the cover cell 910 and the device cell 200 are the same, the first and second slits 301 and 920 may function as alignment keys. Also, as shown in FIG. 9, when the first and second separating portions 302 and 930 are aligned, the first and second separating portions 302 and 930 may function as alignment keys.

In operation 21, in order to align the device cell 200 and the cover cell 910, the first and second alignment keys 110 and 940 may be respectively formed on the first mother glass 100 and the second mother glass 900 as shown in FIGS. 2, 3, and 8. The first and second alignment keys 110 and 940 may be formed in regions of the first mother glass 100 and the second mother glass 900 other than where the plurality of device cells 200 and the plurality of cover cells 910 are formed. Alternatively, the first and second alignment keys 110 and 940 may be formed inside the plurality of device cells 200 and the plurality of cover cells 910.

The first and second alignment keys 110 and 940 may be formed via printing operations. For example, the first and second alignment keys 110 and 940 may be printed respectively on the first mother glass 100 and the second mother glass 900 by using polymer-based ink. The first and second alignment keys 110 and 940 may be respectively carved on the first mother glass 100 and the second mother glass 900.

Operations 6 and 16 may be performed at a high temperature of at least hundreds of degrees Celsius (° C.). When the first and second alignment keys 110 and 940 are formed via printing, operations 5 and 15 may be performed after operations 6 and 16 in order to prevent the first and second alignment keys 110 and 940 from being damaged during operations 6 and 16.

When the first and second alignment keys 110 and 940 are formed via carving, operations 5 and 15 may be performed before operations 6 and 16. For example, operations 5 and 15 may be performed together with operations 2 and 12, or before or after operations 2 and 12. Accordingly, the first and second alignment keys 110 and 940 are formed in the same manner as the device cells 200 and the cover cells 910 are defined in operation 2 and 12, and thus process efficiency may be increased.

Then, operation 22 is performed. In operation 22, the first and second separating portions 302 and 930 are cut to separate the device cell 200 and the cover cell 910 respectively from the first mother glass 100 and the second mother glass 900, thereby obtaining the electronic device 500.

Before operation 22 is performed, the support substrate 800, if used, may be removed from the first mother glass 100.

By performing above operations, the plurality of electronic devices 500 that are individually separated from each other may be obtained.

Then, if required, a packing process may be performed. The packaging process may vary according to the type of the electronic device 500. Examples of the packaging process may include a flexible printed circuit board (FPCB) bonding process, a chip on flexible printed circuit (COF) process, an anisotropic conducting film (ACF) bonding process, an encapsulation process, and an under-fill process.

It should be understood that various exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing an electronic device, the method comprising:
preparing first mother glass and second mother glass;
forming, on the first mother glass, a plurality of device cells partially connected to the first mother glass through a plurality of first separating portions;
patterning a device circuit on each of the plurality of device cells;
forming, on the second mother glass, a plurality of cover cells partially connected to the second mother glass through a plurality of second separating portions;
forming a plurality of electronic devices by laminating the first mother glass and the second mother glass together such that the plurality of device cells are respectively aligned to the plurality of cover cells; and separating the plurality of electronic devices from the first mother glass and the second mother glass by cutting the plurality of first separating portions and the plurality of second separating portions.

2. The method of claim 1, wherein widths of the plurality of first separating portions and the plurality of second separating portions each range between 0.1 mm and 0.5 mm.

3. The method of claim 1, wherein the plurality of first separating portions and the plurality of second separating portions are respectively aligned with each other to function as alignment keys while the first mother glass and the second mother glass are laminated together.

4. The method of claim 1, wherein the plurality of first separating portions and the plurality of second separating portions are misaligned with each other.

5. The method of claim 1, wherein the first mother glass and the plurality of device cells are formed by creating a plurality of first slits on the first mother glass, and the plurality of first separating portions connect the plurality of device cells and the first mother glass across the plurality of first slits, and wherein the second mother glass and the plurality of cover cells are formed by creating a plurality of second slits on the second mother glass, and the plurality of second separating portions connect the plurality of cover cells and the second mother glass across the plurality of second slits.

6. The method of claim 5, wherein the plurality of first slits and the plurality of second slits function as alignment keys while the first mother glass and the second mother glass are laminated together.

7. The method of claim 1, further comprising forming a first alignment key and a second alignment key respectively on the first mother glass and the second mother glass, wherein the first and second alignment keys are bases for alignment while the first mother glass and the second mother glass are laminated together.

8. The method of claim 7, wherein the first and second alignment keys are formed in regions other than the plurality of device cells and the plurality of cover cells.

9. The method of claim 1, wherein a thickness of the first mother glass is less than 0.3 mm.

10. The method of claim 9, further comprising:

adhering the first mother glass to a support substrate before the forming of the plurality of device cells; and removing the support substrate after the patterning of the device circuit.

11. The method of claim 1, wherein a thickness of the first mother glass is greater than or equal to 0.3 mm, and wherein the method further comprises slimming the thickness of the first mother glass after the patterning of the device circuit.

12. The method of claim 1, further comprising tempering the first mother glass after the forming of the plurality of device cells.

13. The method of claim 12, further comprising forming a first alignment key on the first mother glass, wherein the first alignment key is a basis for alignment while the first mother glass and the second mother glass are laminated together.

14. The method of claim 13, wherein the first alignment key is printed on the first mother glass after the tempering of the first mother glass.

15. The method of claim 13, wherein the first alignment key is carved on the first mother glass before the tempering of the first mother glass.

16. The method of claim 1, further comprising tempering the second mother glass after the forming of the plurality of cover cells.

17. The method of claim 16, further comprising forming a second alignment key on the second mother glass, wherein the second alignment key is a basis for alignment while the first mother glass and the second mother glass are laminated together.

18. The method of claim 17, wherein the second alignment key is printed on the second mother glass after the tempering of the second mother glass.

19. The method of claim 17, wherein the second alignment key is carved on the second mother glass before the tempering of the second mother glass.

* * * * *